United States Patent
Lin et al.

(10) Patent No.: US 11,245,022 B2
(45) Date of Patent: Feb. 8, 2022

(54) INTEGRATED DIPOLE FLOW FOR TRANSISTOR

(71) Applicant: Applied Materials, Inc., Santa Clara, CA (US)

(72) Inventors: Yongjing Lin, San Jose, CA (US); Karla M. Bernal Ramos, San Jose, CA (US); Luping Li, Santa Clara, CA (US); Shih Chung Chen, Cupertino, CA (US); Jacqueline S. Wrench, San Jose, CA (US); Yixiong Yang, Fremont, CA (US); Steven C. H. Hung, Sunnyvale, CA (US); Srinivas Gandikota, Santa Clara, CA (US); Naomi Yoshida, Sunnyvale, CA (US); Lin Dong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 61 days.

(21) Appl. No.: 16/876,276

(22) Filed: May 18, 2020

(65) Prior Publication Data
US 2020/0373404 A1 Nov. 26, 2020

Related U.S. Application Data

(60) Provisional application No. 62/852,349, filed on May 24, 2019.

(51) Int. Cl.
*H01L 29/51* (2006.01)
*H01L 29/40* (2006.01)
*H01L 29/49* (2006.01)

(52) U.S. Cl.
CPC .......... *H01L 29/513* (2013.01); *H01L 29/401* (2013.01); *H01L 29/4958* (2013.01); *H01L 29/4966* (2013.01)

(58) Field of Classification Search
CPC .................. H01L 29/4966; H01L 29/4958
See application file for complete search history.

(56) References Cited

U.S. PATENT DOCUMENTS

| 6,150,680 A | 11/2000 | Eastman et al. |
| 20,070,158 | 7/2007 | Doczy et al. |

(Continued)

FOREIGN PATENT DOCUMENTS

| CN | 103413832 A | 11/2013 |
| WO | 9945594 A1 | 9/1999 |

OTHER PUBLICATIONS

PCT International Search Report and Written Opinion in PCT/US2020/033623 dated Oct. 20, 2020, 12 pages.

(Continued)

*Primary Examiner* — Farun Lu
(74) *Attorney, Agent, or Firm* — Servilla Whitney LLC

(57) ABSTRACT

Methods of forming and processing semiconductor devices are described. Certain embodiments related to electronic devices which comprise a dipole region having an interlayer dielectric, a high-κ dielectric material, and a dipole layer. The dipole layer comprises one or more of titanium lanthanum nitride (TiLaN), titanium yttrium nitride (TiYN), titanium strontium nitride (TiSrN), titanium magnesium nitride (TiMgN, titanium aluminum nitride (TiAlN), titanium tantalum nitride (TiTaN), hafnium carbide (HfC), hafnium nitride (HfN), hafnium oxynitride (HfON), hafnium oxycarbide (HfOC), hafnium carbide aluminum (HfCAl), hafnium aluminum nitride (HfAlN), or hafnium carbonitride (HfCN).

7 Claims, 4 Drawing Sheets

(56) References Cited

U.S. PATENT DOCUMENTS

| | | |
|---|---|---|
| 8,168,547 B2 | 5/2012 | Nabatame |
| 8,420,474 B1* | 4/2013 | Frank ................. H01L 27/1203 |
| | | 438/199 |
| 2011/0147798 A1* | 6/2011 | Radosavljevic .... H01L 21/2256 |
| | | 257/194 |
| 2013/0099328 A1 | 4/2013 | Xu et al. |
| 2017/0179252 A1* | 6/2017 | Tang ................. H01L 29/66446 |
| 2019/0088798 A1 | 3/2019 | Kim et al. |
| 2019/0148237 A1 | 5/2019 | Wang |
| 2019/0279913 A1* | 9/2019 | Gluschenkov ........ H01L 29/513 |

OTHER PUBLICATIONS

Lin, Yu-Hsian, et al., "Work Function Adjustment by Using Dipole Engineering for TaN—Al2O3—Si3N4—HfSiOx-Silicon Nonvolatile Memory", Materials 2015, 8, 5112-5120; doi:10.3390/ma8085112, Aug. 7, 2015.

\* cited by examiner

INTEGRATED DIPOLE FLOW FOR TRANSISTOR

CROSS-REFERENCE TO RELATED APPLICATIONS

This application claims priority to U.S. Provisional Application No. 62/852,349, filed May 24, 2019, the entire disclosure of which is hereby incorporated by reference herein.

TECHNICAL FIELD

Embodiments of the present disclosure pertain to the field of electronic device manufacturing, and in particular, to transistors. More particularly, embodiments of the disclosure are directed to FinFET devices and methods of manufacturing FinFET devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

As device dimensions have shrunk, device geometries and materials have experienced difficulty maintaining switching speeds without incurring failures. Several new technologies emerged that allowed chip designers to continue shrinking gate lengths. Control of the dimensions of device structure is a key challenge for present and future technology generations. Since 1970, the number of components per chip has doubled every two years. As a consequence of this trend, the miniaturization of circuits by scaling down the transistor has been the principal driver for the semiconductor technology roadmap. Shrinking of the materials currently used as N- and P-MOS have become a challenge due to change in basic properties, such as threshold voltage. Additionally, the migration of transistor technology from planar to FinFET, requires conformal work function layers with the solution for multiple threshold voltages. The voltage tuning range is limited by the thickness variation, with further scaling down of device sizes. Therefore, there is a need to develop alternative materials to achieve better performance while scaling down.

SUMMARY

One or more embodiments are directed to electronic devices and methods of manufacturing electronic devices. In one or more embodiments, an electronic device comprises: a source region, a drain region and a channel separating the source region and drain region; and a dipole region on a top surface of the channel, the dipole region comprising an interlayer dielectric, a high-κ dielectric material, and a dipole layer.

In one or more embodiments, a method of manufacturing an electronic device comprises: depositing an interlayer dielectric on a top surface of a channel located between a source and a drain on a substrate; depositing a high-κ dielectric material on the interlayer dielectric; and depositing a dipole layer on the high-κ dielectric material.

In one or more embodiments, an electronic device comprises: a source region having a source and a source contact, the source region on a top surface of a substrate; a drain region having a drain and a drain contact, the drain region on the top surface of the substrate; a channel located between the source and the drain; and a dipole region on a top surface of the channel, the dipole region comprising an interlayer dielectric, a high-κ dielectric material, and a dipole layer comprising one or more of titanium lanthanum nitride (TiLaN), titanium yttrium nitride (TiYN), titanium strontium nitride (TiSrN), titanium magnesium nitride (TiMgN, titanium aluminum nitride (TiAlN), titanium tantalum nitride (TiTaN), hafnium carbide (HfC), hafnium nitride (HfN), hafnium oxynitride (HfON), hafnium oxycarbide (HfOC), hafnium carbide aluminum (HfCAl), hafnium aluminum nitride (HfAlN), or hafnium carbonitride (HfCN).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
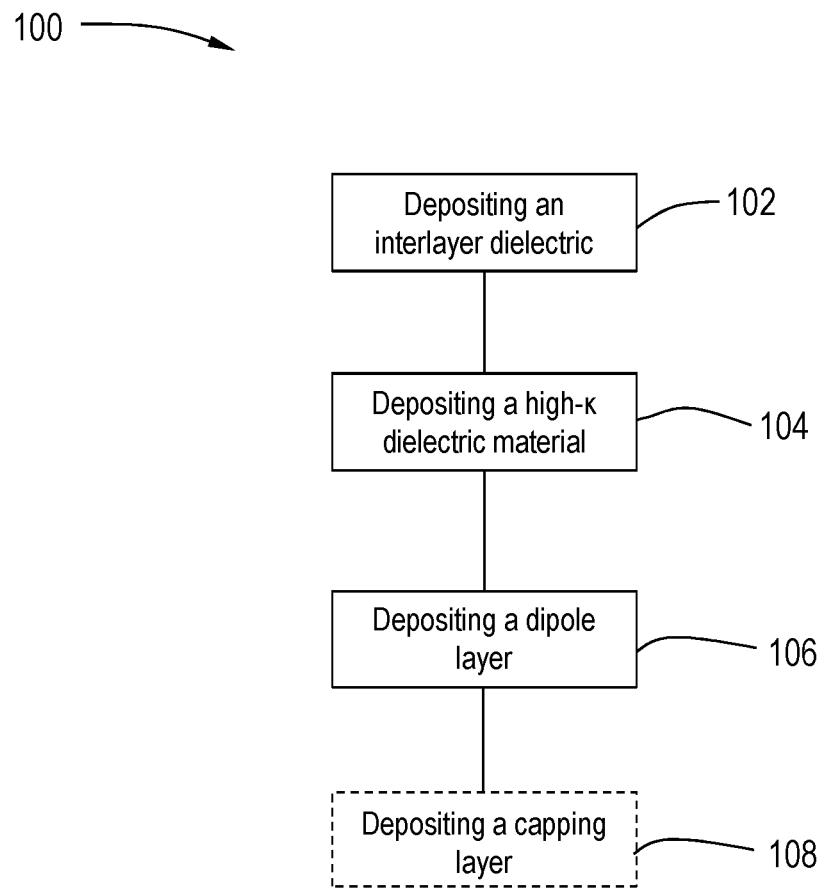
FIG. 1 depicts a process flow diagram of one embodiment of a method according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors are voltage controlled devices where its current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e. $I_D$) can be controlled.

The metal-oxide-semiconductor field-effect transistor (MOSFET) is a type of field-effect transistor (FET) and is used in integrated circuits and high speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET, is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode and saturation. Circuits with NMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices.

Furthermore, NMOS ICs would be smaller than PMOS ICs (that give the same functionality), since the NMOS can provide one-half of the impedance provided by a PMOS (which has the same geometry and operating conditions).

As used herein, the term "fin field-effect transistor (FinFET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

In one or more embodiments, advantageously provided are hafnium-based materials that exhibit p-metal behavior. The materials of one or more embodiments include, but are not limited to, hafnium carbide (HfC), hafnium nitride (HfN), hafnium oxinitride (HfON), hafnium oxicarbide (HfOC), hafnium carbide aluminum (HfCAl), hafnium aluminum nitride (HfAlN), and hafnium carbide nitride (HfCN).

In one or more embodiments, provided are films comprising hafnium-based materials. The films, which can deposited by atomic layer deposition, show PMOS work function capabilities. The growth of the hafnium-based materials was developed in an ALD chamber with temperature ranging from 200° C. to 500° C. The precursors used to grow hafnium carbide are selected from hafnium tetrachloride, hafnium tetraiodide, and aluminum-based precursors such as, but not limited to, triethylaluminum, trimethylaluminum, trisneopentylaluminum, tetrabutylaluminum. An in situ capping layer, such as TiN or TiAl, can be used to control film oxidation after deposition.

One or more embodiments advantageously provide a dipole flow including a composite stack $TiX^1N$ and $TiX^2N$ deposited by atomic layer deposition as n and p dipole to shift the work function. The $TiX^1N$ compositions for n dipole includes, but is not limited to, TiLaN, TiYN, TiSrN, and TiMgN. The $TiX^2N$ for p dipole includes, but is not limited to, TiAlN and TiTaN.

The embodiments of the disclosure are described by way of the Figures, which illustrate devices (e.g. transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 depicts a flow diagram of a method 100 in accordance with one or more embodiments of the present disclosure. With reference to FIG. 1, the method 100 begins at operation 102 by depositing an interlayer dielectric on a top surface of a channel located between a source and a drain on a substrate. At operation 104, a high-κ dielectric material is deposited on the interlayer dielectric. At operation 106, a dipole layer is deposited on the high-κ dielectric material. At operation 108, a capping layer is optionally deposited on the dipole layer.

Figure 2:
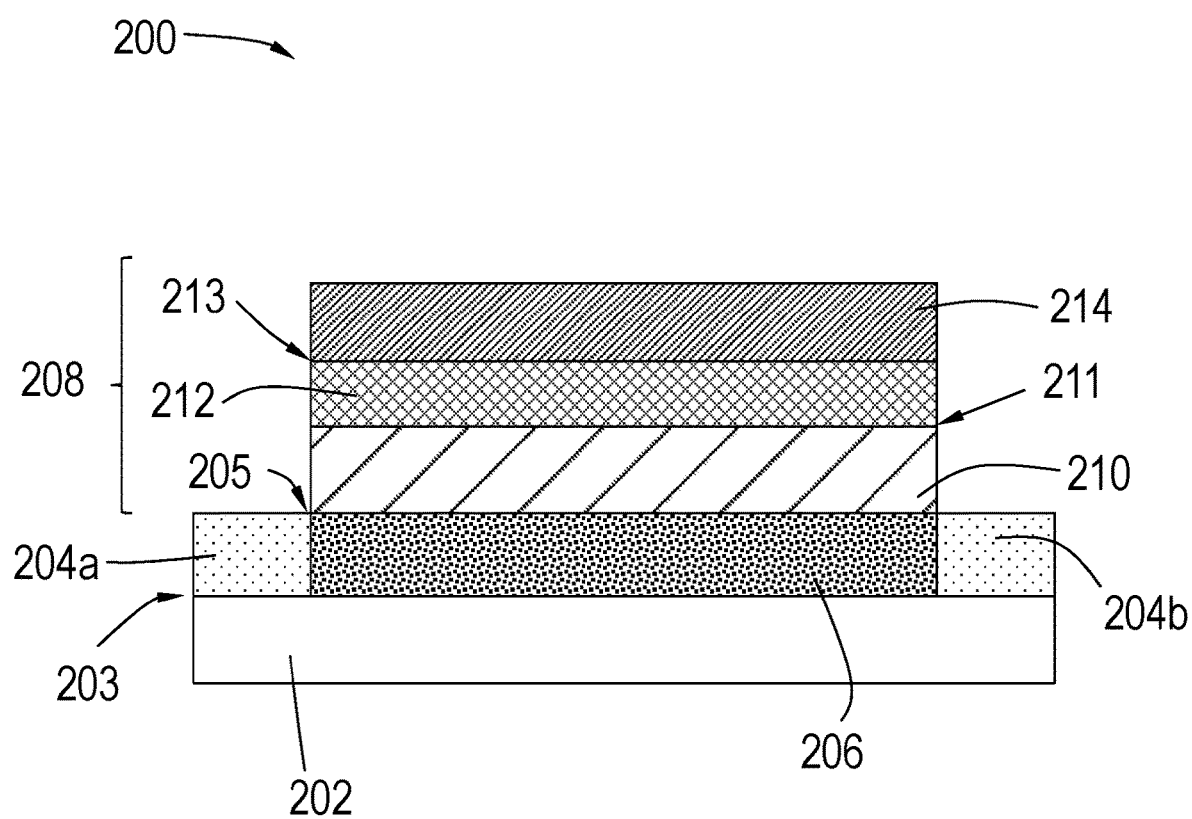
FIG. 2 illustrates a cross-sectional view of a substrate according to one or more embodiments.
Figure 3A:
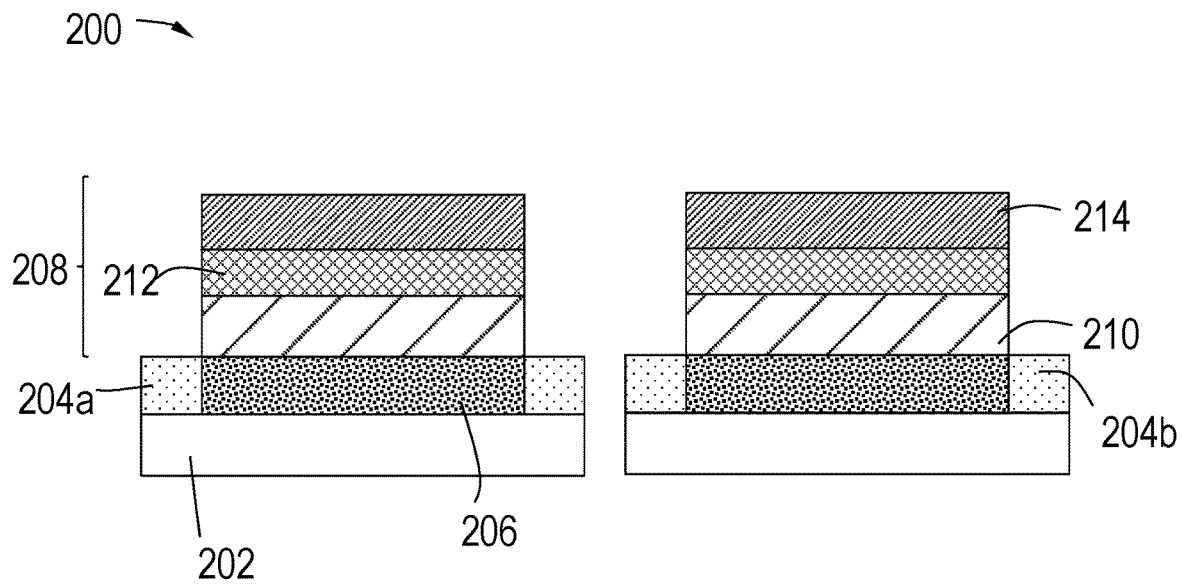
FIG. 3A illustrates a cross-sectional view of a substrate according to one or more embodiments.
Figure 3B:
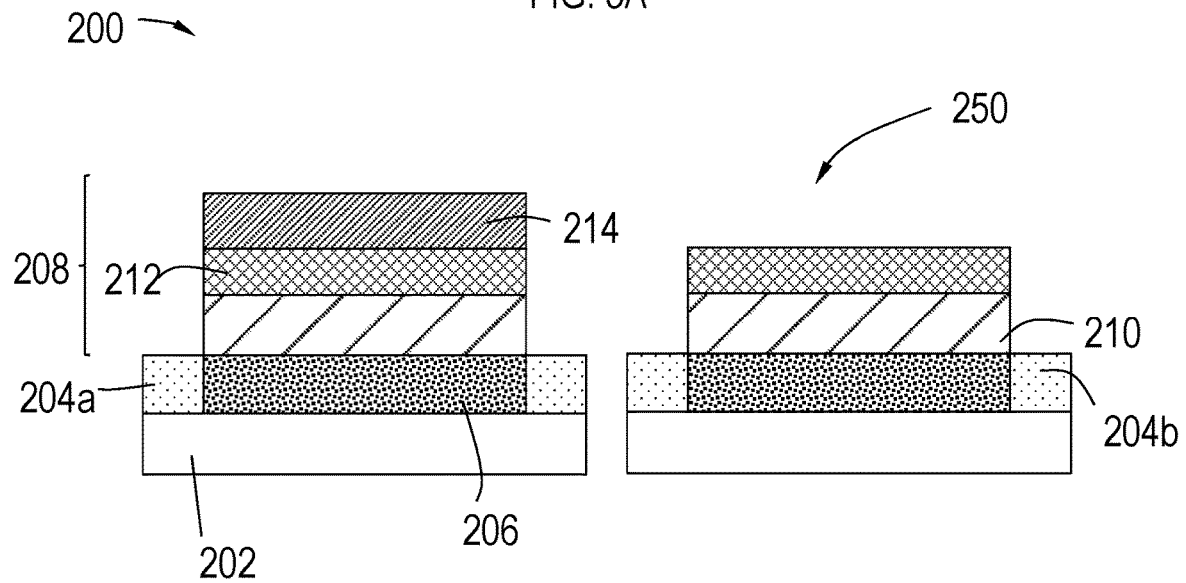
FIG. 3B illustrates a cross-sectional view of a substrate according to one or more embodiments.

FIG. 2 and FIGS. 3A and 3B are cross-section views of an electronic device (e.g. a transistor) 200 according to one or more embodiments. With reference to FIG. 2 and FIG. 3A, an electronic device 200 comprises a semiconductor substrate 202 having a top surface 203. The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 202 comprises one or more of silicon (Si), germanium (Ge), gallium (Ga), arsenic (As), indium (In), phosphorus (P), copper (Cu), or selenium (Se). Although a few examples of materials from which the substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 202 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

With reference to FIG. 2 and FIG. 3A, a source region 204a is on the top surface 203 of the semiconductor substrate 202. In one or more embodiments, the source region 204a has a source and a source contact (not illustrated). A drain region 204b is on the top surface 203 of the semiconductor substrate 202 opposite the source region 204a. In one or more embodiments, the drain region 204b has a drain and a drain contact (not illustrated).

In one or more embodiments, the source region 204a and/or the drain region 204b can be any suitable material known to the skilled artisan. In one or more embodiments, the source region 204a and/or the drain region 204b may have more than one layer. For example, the source region 204a and/or the drain region 204b may independently comprise three layers. In one or more embodiments, the source region 204a and the drain region 204b may independently comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source region 204a and the drain region 204b may independently comprise a bottom layer of silicon with doped epi (e.g. SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

In some embodiments, the source region 204a and the drain region 204b may be raised source/drain regions formed by EPI growth.

In one or more embodiments, the source contact and/or the drain contact may independently be selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more embodiments, formation of the source contact and/or the drain contact is conducted by any suitable process known to the skilled artisan, including, but not limited to ALD, CVD, PVD, MBE, MOCVD, spin-on, or other insulating layer deposition techniques known to the skilled artisan.

In one or more embodiments, a channel 206 is located between the source 204a and the drain 204b.

In one or more embodiments, a dipole region 208 overlies the channel 206 and is in contact with one or more of the channel 206, the source region 204a, and the drain region 204b. In one or more embodiments, the dipole layer has a thickness less than about 50 Å.

In one or more embodiments, the dipole region 208 comprises one or more of an interlayer dielectric (ILD) 210, a high-κ dielectric material 212, and a dipole layer 214. In some embodiments, the dipole region 208 comprises an interlayer dielectric (ILD) 210, a high-κ dielectric material 212, and a dipole layer 214.

In one or more embodiments, an interlayer dielectric (ILD) 210 is deposited on a top surface 205 of the channel 206. In one or more embodiments, the interlayer dielectric 210 can be any suitable material known to the skilled artisan. For example, in one or more embodiments, the interlayer dielectric 210 comprises a low-κ dielectric. In one or more embodiments, the low-κ dielectric is selected from one or more of silicon, silicon oxide, silicon nitride, silicon oxynitride, silicon oxycarbide, silicon carbooxynitride, SiCONH, doped silicon, doped silicon oxide, doped silicon nitride, doped silicon oxynitride, spin-on dielectrics, or diffusion species growths. In one or more embodiments, the interlayer dielectric 210 comprises silicon oxide. The interlayer dielectric (ILD) 210 can be deposited using one or more deposition techniques known to one of ordinary skill in the art of microelectronic device manufacturing. In one or more embodiments, interlayer dielectric (ILD) 210 is deposited using one of deposition techniques, such as, but not limited to, ALD, CVD, PVD, MBE, MOCVD, spin-on, or other insulating layer deposition techniques known to the skilled artisan. In one or more embodiments, the interlayer dielectric (ILD) 210 may be formed by etching and an oxide forming on the surface.

In one or more embodiments, a high-κ dielectric material 212 is deposited on a top surface 211 of the interlayer dielectric (ILD) 210. The high-κ dielectric material 212 can be any suitable high-κ dielectric material known to the skilled artisan. In one or more embodiments, the high-κ dielectric material 212 comprises hafnium oxide or a lanthanum (La) doped high-κ dielectric. In one or more embodiments, high-κ dielectric material 212 is deposited using one of deposition techniques, such as, but not limited to, ALD, CVD, PVD, MBE, MOCVD, spin-on, or other insulating layer deposition techniques known to the skilled artisan.

Typically, a high-κ capping layer, such as titanium nitride (TiN), is deposited on a top surface of the high-κ dielectric material. However, in one or more embodiments, a dipole layer 214 is deposited in place of the high-κ dielectric material.

In one or more embodiments, a dipole layer 214 is deposited on a top surface 213 of the high-κ dielectric material 212. In one or more embodiments, the dipole layer 214 is deposited using one of deposition techniques, such as, but not limited to, ALD, CVD, PVD, MBE, MOCVD, spin-on, or other insulating layer deposition techniques known to the skilled artisan. In one or more specific embodiments, the dipole layer 214 is deposited by atomic layer deposition (ALD). In one or more embodiment, the dipole layer 214 is deposited by atomic layer deposition at a temperature in the range of about 200° C. to about 500° C.

In one or more embodiments, when the channel 206 comprises n-type material, the dipole layer 214 comprises a $TiX^1N$ material, wherein $X^1$ is a metal selected from one or more of lanthanum (La), yttrium (Y), strontium (Sr), or magnesium (Mg). Other metals known to the skilled artisan may be used as $X^1$. Thus, in one or more embodiments, wherein the channel 206 comprises n-type material, the dipole layer 214 comprises one or more of titanium lanthanum nitride (TiLaN), titanium yttrium nitride (TiYN), titanium strontium nitride (TiSrN), or titanium magnesium nitride (TiMgN).

Referring to FIGS. 3A and 3B, in one or more embodiments, the dipole layer 214 comprises a $TiX^1N$ film that is deposited by atomic layer deposition between about 200° C. to about 500° C. In one or more embodiments, the $TiX^1N$ ($X^1$ includes, but is not limited to, La, Y, Sr, Mg) is deposited with alternating cycles of TiN and $X^1N$. In one or more embodiments, the $X^1N$ content in the composite dipole layer 214 is tunable by adjusting the cycle ratio between TiN and $X^1N$. Referring to FIG. 3B, in one or more embodiments, the $TiX^1N$ dipole layer 214 on the PFET side 250 is removed by patterning.

In one or more embodiments, when the channel 206 comprises p-type material, the dipole layer 214 comprises $TiX^2N$ material, wherein $X^2$ is a metal selected from one or more of aluminum (Al), tantalum (Ta), or vanadium (V). In one or more embodiments, the P-dipole layer 214 composite $TiX^2N$ is deposited by atomic layer deposition at temperature between about 200° C. to about 500° C. In one or more embodiments, the TiX²N (X² includes but is not limited to Al, Ta, or V) is deposited with alternating cycles of TiN and X²N. In one or more embodiments, the X²N content in the composite dipole layer 214 is tunable by adjusting the cycle ratio between TiN and X²N.

In one or more embodiments, the channel 206 comprises p-type material and the dipole layer 214 comprises one or more of titanium aluminum nitride (TiAlN), titanium tantalum nitride (TiTaN), titanium hafnium nitride (TiHfN), hafnium carbide (HfC), hafnium nitride (HfN), hafnium oxynitride (HfON), hafnium oxycarbide (HfOC), hafnium carbide aluminum (HfCAl), hafnium aluminum nitride (HfAlN), or hafnium carbonitride (HfCN).

In one or more embodiments, a high temperature thermal annealing is conducted to drive both X¹ and X² in the high-κ material 212 to form n and p dipole. The remaining TiN serves directly as high-κ capping layer.

Without intending to be bound by theory, it is thought that a dipole layer comprising TiX¹N or TiX²N materials simplifies the existing integration flow, reducing the integration costs. Additionally, when X¹N or X²N is embedded in the TiN layer, it is thought that oxidation can be reduced, which would potentially reduce the annealing temperature required. Furthermore, the above described composite dipole layer 214 method provides excellent control of the amount of X¹ or X², allowing multi-voltage tenability of the electronic devices.

In one or more embodiments, hafnium-based materials that exhibit p-metal behavior may be deposited by atomic layer deposition, on a semi-conductor substrate as a dipole layer 214 or as a work-function layer (not illustrated). In one or more embodiments, the hafnium-based materials include, but are not limited to, hafnium carbide (HfC), hafnium nitride (HfN), hafnium oxynitride (HfON), hafnium oxycarbide (HfOC), hafnium carbo aluminum (HfCAl), hafnium aluminum nitride (HfAlN), and hafnium carbonitride (HfCN). In one or more embodiments, the hafnium-based materials show PMOS work function capabilities. In one or more embodiments, the growth of the hafnium-based materials is developed in an ALD chamber with temperatures ranging from about 200° C. to about 500° C. In one or more embodiments, the precursors used to grow hafnium carbide include, but are not limited to, hafnium tetrachloride and aluminum-based precursors such as triethylaluminum, trimethylaluminum, trisneopentylaluminum, and tetrabutylaluminum. In one or more embodiments, an in situ capping layer, e.g. titanium nitride (TiN) or titanium aluminum (TiAl), may be used to control film oxidation after deposition.

Without intending to be bound by theory, it is thought that the advantage of hafnium-based materials as p-type work function materials include a work function higher than 5.0 eV, which is higher than existing industrial TiN baseline, enabling the shrinking of transistors in size; MOSCAP shifts to the PMOS range creating p-metal work function; electrical data shows better EOT compared with a titanium nitride (TiN) film; lower leakage current of hafnium carbide is observed when compared to titanium aluminum (TiAl); hafnium-based films show a unique thickness dependency as p-type materials (with thinner hafnium-based films, the flat band voltage of MOSCAP shifts toward Si valance band edge, allowing for usage of extremely thin films for transistor scaling without impacting device performance); and the threshold voltage of electronic devices with hafnium-based films as p-type work function materials can be tuned with titanium nitride (TiN) capping. Thus, in one or more embodiments, the hafnium-based materials can be used as work-function layers or as dipole layers.

In one or more embodiments, a gate comprising one or more of a gate metal (not illustrated) or a gate contact (not illustrated) may optionally be formed or deposited on the exposed surface of the dipole region 208. The gate metal may be any material known to one of skill in the art. In one or more embodiments, the gate metal comprises one or more of nitrogen (N), copper (Cu), cobalt (Co), tungsten (W), titanium (Ti), tantalum (Ta), molybdenum (Mo), nickel (Ni), ruthenium (Ru), silver (Ag), gold (Au), iridium (Ir), aluminum (Al), or platinum (Pt). In one or more specific embodiments, the gate metal comprises a metal selected from one or more of nitrogen (N), cobalt (Co), tungsten (W), titanium (Ti), molybdenum (Mo), nickel (Ni), ruthenium (Ru), silver (Ag), iridium (Ir), aluminum (Al), or platinum (Pt). In other specific embodiments, the gate metal 226 comprises a metal selected from one or more of nitrogen (N), cobalt (Co), tungsten (W), titanium (Ti), molybdenum (Mo), or ruthenium (Ru). In one or more embodiments, the gate contact may be any suitable material known to the skilled artisan. In one or more embodiments, the gate contact is selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), aluminum (Al), or platinum (Pt).

In one or more embodiments, a capping layer may be deposited on the exposed surface of the dipole region 208. In one or more embodiments, the capping layer may comprise one or more of titanium nitride (TiN) or titanium aluminum (TiAl).

One or more embodiments are directed to an electronic device comprising a source region having a source and a source contact, the source region on a top surface of a substrate; a drain region having a drain and a drain contact, the drain region on the top surface of the substrate; a channel located between the source and the drain; and a dipole region on a top surface of the channel, the dipole region comprising an interlayer dielectric, a high-κ dielectric material, and a dipole layer comprising one or more of titanium lanthanum nitride (TiLaN), titanium yttrium nitride (TiYN), titanium strontium nitride (TiSrN), titanium magnesium nitride (TiMgN, titanium aluminum nitride (TiAlN), titanium tantalum nitride (TiTaN), hafnium carbide (HfC), hafnium nitride (HfN), hafnium oxynitride (HfON), hafnium oxycarbide (HfOC), hafnium carbide aluminum (HfCAl), hafnium aluminum nitride (HfAlN), or hafnium carbonitride (HfCN).

Figure 4:
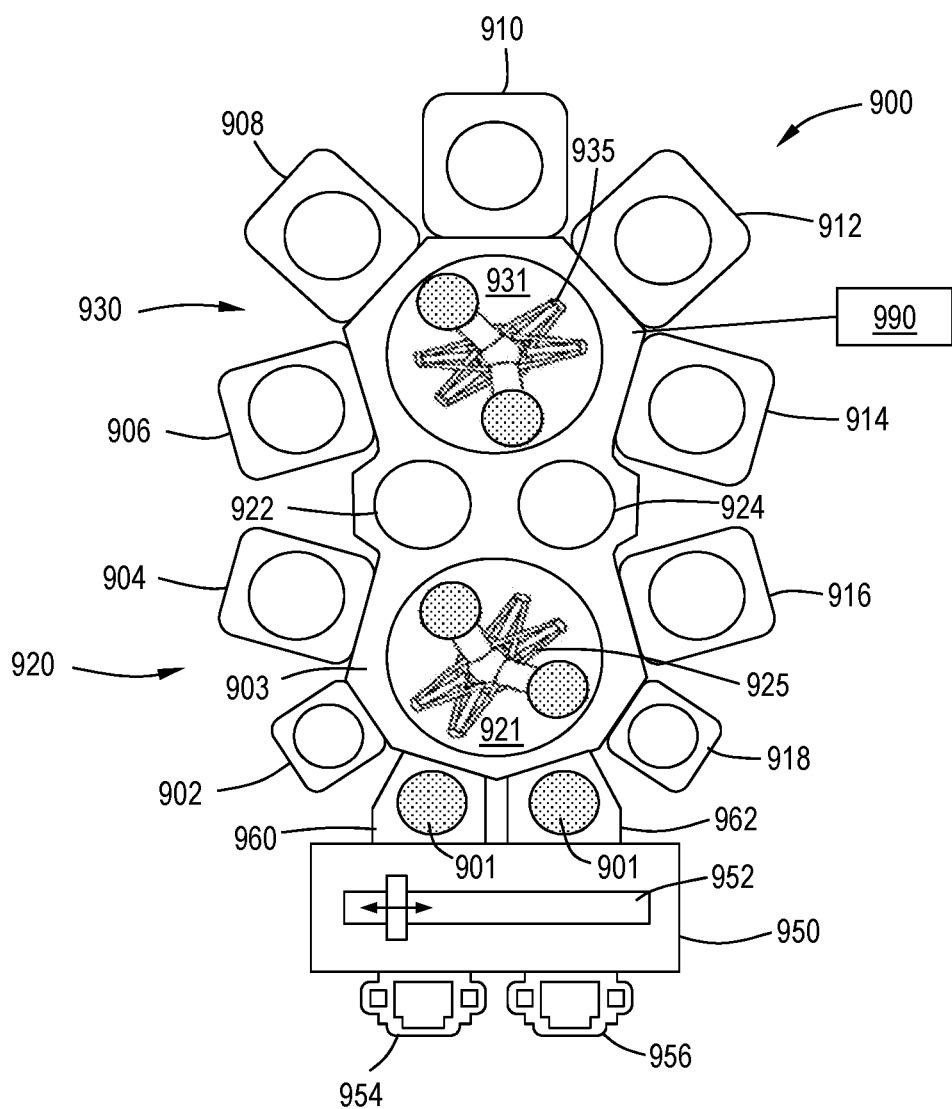
FIG. 4 illustrates a cluster tool according to one or more embodiments of the disclosure.

Additional embodiments of the disclosure are directed to processing tools 900 for the formation of the logic/memory devices and methods described, as shown in FIG. 4.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD)

chamber. The particular arrangement of process chambers and components can be varied depending on the cluster tool and should not be taken as limiting the scope of the disclosure.

In one or more embodiments, the cluster tool 900 includes a silicon oxide (SiO$_2$) chamber to deposit silicon oxide (SiO$_2$). The silicon oxide (SiO$_2$) deposition chamber of some embodiments comprises an atomic layer deposition chamber, a plasma enhanced atomic layer deposition chamber, or a spatial atomic layer deposition chamber. In one or more embodiments, the cluster tool 900 includes a pre-cleaning chamber connected to the central transfer station.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the processing tool 900 comprises a central transfer station 921, 931 comprising at least one robot 925, 935 configured to move a wafer; one or more of a rapid thermal processing (RTP) station, a decoupled plasma oxidation (DPO), or decoupled plasma nitridation (DPN) station connected to the central transfer station; an atomic layer deposition (ALD) station connected to the central transfer station; an optional pre-clean station connected to the central transfer station; and at least one controller connected to the one or more of the central transfer station, the RTP station, the DPO station, the DPN station, the ALD station or the optional pre-clean station. In one or more embodiments, the at least one controller has at least one configuration selected from: a configuration to move the wafer between stations using the robot; a configuration to perform a rapid thermal process; a configuration to perform a decoupled plasma process; a configuration to control a flow of an oxidizing gas into the RTP station or DPO station; a configuration to control a flow of a nitriding gas into the RTP station or DPN station; a configuration to deposit a silicon oxide film by atomic layer deposition; and a configuration to pre-clean the wafer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:
    depositing an interlayer dielectric on a top surface of a channel located between a source and a drain on a substrate;
    depositing a high-κ dielectric material on the interlayer dielectric; and
    depositing a dipole layer on the high-κ dielectric material,
        wherein the dipole layer comprises one or more of titanium lanthanum nitride (TiLaN), titanium yttrium nitride (TiYN), titanium strontium nitride (TiSrN), titanium magnesium nitride (TiMgN), titanium aluminum nitride (TiAlN), or titanium tantalum nitride (TiTaN), and
        wherein depositing the dipole layer comprises atomic layer deposition, at a temperature in a range of about 200° C. to about 500° C., of alternating cycles of titanium nitride (TiN) and a dipole precursor.

2. The method of claim 1, wherein the dipole precursor comprises one or more of lanthanum nitride (LaN), yttrium nitride (YN), strontium nitride (SrN), magnesium nitride (MgN), aluminum nitride (AlN), or tantalum nitride (TaN).

3. The method of claim 1, wherein the dipole region has a thickness of less than about 50 Å.

4. A method of manufacturing an electronic device, the method comprising:
    depositing an interlayer dielectric on a top surface of a channel located between a source and a drain on a substrate;
    depositing a high-κ dielectric material on the interlayer dielectric; and
    depositing a dipole layer on the high-κ dielectric material,
        wherein the dipole layer comprises one or more of hafnium carbide (HfC), hafnium nitride (HfN), hafnium oxynitride (HfON), hafnium oxycarbide (HfOC), hafnium carbide aluminum (HfCAl), hafnium aluminum nitride (HfAlN), or hafnium carbonitride (HfCN), and
        wherein depositing the dipole layer comprises atomic layer deposition, at a temperature in a range of about 200° C. to about 500° C. of alternating cycles of a hafnium precursor and a second precursor.

5. The method of claim 4, wherein the hafnium precursor comprises hafnium tetrachloride and the second precursor comprises one or more of triethylaluminum, trimethylaluminum, trisneopentylaluminum, tetrabutylaluminum, or ammonia.

6. The method of claim 5, further comprising in situ deposition of a capping layer, the capping layer comprising one or more of titanium nitride or titanium aluminum.

7. The method of claim 4, wherein the dipole region has a thickness of less than about 50 Å.

* * * * *